United States Patent [19]

Park

[11] Patent Number: 5,680,065
[45] Date of Patent: Oct. 21, 1997

[54] SMALL COMPUTER SYSTEM INTERFACE BUS DRIVING CIRCUIT WITH UNIQUE ENABLE CIRCUITRY

[75] Inventor: Hyun Ju Park, Seoul, Rep. of Korea

[73] Assignee: LG Semicon Co., Ltd., Cheongju, Rep. of Korea

[21] Appl. No.: 545,966

[22] Filed: Oct. 20, 1995

[30] Foreign Application Priority Data

Oct. 21, 1994 [KR] Rep. of Korea .............. 26962/1994

[51] Int. Cl.$^6$ .................................................. H03K 19/0175
[52] U.S. Cl. ........................................... 326/86; 326/56
[58] Field of Search ............................... 326/82, 83, 86, 326/56, 57, 58; 327/108

[56] References Cited

U.S. PATENT DOCUMENTS

| | | | |
|---|---|---|---|
| 4,342,065 | 7/1982 | Larson | 326/56 |
| 4,945,264 | 7/1990 | Lee et al. | 326/86 |
| 5,214,330 | 5/1993 | Okazaki | 326/56 |
| 5,361,005 | 11/1994 | Slattery et al. | 326/82 |
| 5,448,180 | 9/1995 | Kienzler et al. | 326/86 |
| 5,519,345 | 5/1996 | Farrell et al. | 326/56 |

FOREIGN PATENT DOCUMENTS 3-252218  11/1991  Japan .............. 326/56

OTHER PUBLICATIONS

Weste et al.; "Principles of CMOS VLSI Design, A Systems Perspective"; reprinted in Jun. 1988; copyright 1985 by AT&T Bell Laboratories, Inc. and Kamran Eshraghian.

Primary Examiner—Edward P. Westin
Assistant Examiner—Benjamin D. Driscoll
Attorney, Agent, or Firm—Fleshner & Kim

[57] ABSTRACT

An improved SCSI bus driving circuit is capable of speedily transmitting a data irrespective of the length of a small computer system interface bus cable or the number of targets connected to a host computer. The circuit includes an output buffer for buffering the output signal of a data output terminal of a host computer; and an enabling circuit for detecting the output signal of the output buffer using a logic threshold voltage of a logic gate and logically combining the signal detected and the output signal of a mode selection terminal outputted from the host computer.

29 Claims, 4 Drawing Sheets

5,680,065

1

SMALL COMPUTER SYSTEM INTERFACE BUS DRIVING CIRCUIT WITH UNIQUE ENABLE CIRCUITRY

BACKGROUND OF THE INVENTION

1. Field of the Invention

The present invention relates to a small computer system interface bus driving circuit, and particularly to an improved small computer system interface bus driving circuit capable of fast transmission of a data irrespective of the length of a small computer system interface (hereinafter called the "SCSI") bus cable or the number of targets connected to a host computer.

2. Description of the Conventional Art

Conventionally, referring to FIG. 1, a SCSI system includes a host computer 100 for outputting an input/output (hereinafter called the "I/O") command, a target 110 for executing the I/O command in accordance with a control signal of the host computer 100, a SCSI bus 120 for forming a transmission path between the host computer 100 and the target 110, and a plurality of peripherals 110a through 110n consisting of a hard disk drive, a CD-ROM 110b, and the like.

The host computer 100 and the target 110 each includes SCSI controllers 100a and 130a through 130n for controlling an SCSI protocol, wherein each of the SCSI controllers 100a and 130a through 130n includes an SCSI bus driving circuit for driving an SCSI bus 120.

In addition, the SCSI bus 120 includes a plurality of control lines (e.g., 9 lines) and a plurality of data lines (e.g., 9 lines), and the SCSI bus driving circuit is classified into a single-ended type and a differential type. The single-ended type SCSI bus driving circuit is classified into an open collector type and a 3-state type, as shown in FIG. 2A.

Referring to FIG. 2A, the SCSI system consisting of the open collector type includes a host SCSI bus driving circuit 200 provided in the SCSI controller 100a of the host computer 100 for executing an I/O command, resistors R1 and R2 in series between a power voltage Vdd and a ground, a capacitance terminator 210 connected to an SCSI bus 220 and having a common connection point of the resistors R1 and R2 connected to a ground through a capacitor CL for interfacing a data, and a target SCSI bus driving circuit 230 provided in the SCSI controllers 130a through 130n of the target having the same function as the host SCSI bus driving circuit 200 for transmitting/receiving a data through the SCSI bus 220.

The host SCSI bus driving circuit 200 includes a NOR gate 201 for NORing the signal outputted from a mode selection terminal MSEL and a data output terminal DOUT. An NMOS transistor 202 has a drain connected to the SCSI bus 220, a source connected to the ground, and a gate receiving the output signal of the NOR gate 201, and a buffer 203 buffers the data outputted from the connection point between the drain of the NMOS transistor 202 and the SCSI bus 220. The transistor 202 outputs the data to a data input terminal DIN. In addition, the target SCSI bus driving circuit 230 has the same functions as the host SCSI driving circuit 200, and the MOS transistors M1 through Mn denote the SCSI bus driving circuit of the SCSI controllers 130a through 130n.

Referring to FIG. 2B, the SCSI system consisting of a 3-state SCSI bus driving circuit includes a host SCSI bus driving circuit 300 provided in the SCSI controller 100a of the host computer 100 for outputting an I/O output, and a

2 capacitance terminator 310 having the same construction as a storing terminator 210 of FIG. 2A. A target SCSI bus driving circuit 330 provided in the SCSI controllers 130a through 130n of the target 110 has the same functions as the host SCSI bus driving circuit 300 for receiving/transmitting a data through the SCSI bus 320.

The host SCSI bus driving circuit 300 includes an OR gate 301 for ORing the signals outputted from the SCSI controller 100a, the mode selection terminal MSEL, and the data output terminal DOUT. A buffer 302, which is low-activated in accordance with a signal outputted from the OR gate 301, buffers the output signal of the OR gate 301 and outputs to the SCSI bus 320. A buffer 303 has an input terminal connected to the output terminal of the buffer 302 for buffering the input signal applied thereto and for outputting to the data input terminal DIN. In addition, the target SCSI bus driving circuit 330 has the same concept of features as the target SCSI bus driving circuit 230.

The operation of the conventional SCSI system will now be explained.

To begin with, the signal transmission in the SCSI protocol is executed between one host computer and five targets, so that the control of the signal transmission direction is controlled by the side of the targets, and the host computer and the targets cannot be either an input mode or an output mode at the same time.

Referring to FIG. 2A, in the SCSI bus driving circuit 200, when a high level signal outputted from the host computer 100 through the mode selection terminal MSEL is applied to one side of the NOR gate, the NOR gate outputs a low level signal irrespective of the signal state applied to the other side thereof. When the low level signal is applied to the gate of the NMOS transistor 202, the NMOS transistor 202 is tuned off, and in the capacitance terminator 210, the power voltage Vdd is applied to the output side of the SCSI bus driving circuit 210 after the power voltage Vdd is divided by the resistors R1 and R2. When the output signal of the mode selection terminal MSEL is a high level, the output signal of the SCSI bus driving circuit 200 enters a high level state, becomes an input mode for receiving the data outputted from the target SCSI driving circuit 230, and receives an input signal of an active low state outputted from the target SCSI bus driving circuit 230 through the buffer 203.

In states that the NMOS transistor 202 is turned off, and a high level signal is applied to the output side of the SCSI bus driving circuit 230. When the NMOS transistors M1 through Mn is mined on/off in accordance with a data outputted from the target SCSI bus driving circuit 230, the output voltage of the host SCSI driving circuit 200 is converted into a low level state or a high level state, and the data is buffered by the buffer and is transmitted to the SCSI controller 100a of the host computer 100 through the data input terminal DIN.

In addition, in the SCSI bus driving circuit 200 of the host computer 100, when the signal outputted from the mode selection terminal MSEL is a low level state, it enters an output mode. When the low level signal is applied to one side of the NOR gate 201, the NOR gate 201 NORs the output signal of a data output terminal DOUT. The NMOS transistor 202 is turned on/off in accordance with an output signal of the NOR gate 201. When the signal of the data output terminal DOUT applied to the NOR gate 201 is a high level state, the NOR gate 201 outputs the low level signal, and the NMOS transistor 202 is turned off. When the NMOS transistor 202 is turned off, the power voltage Vdd divided by the resistors R1 and R2 in the capacitance terminator 210 cannot pass through the NMOS transistor 202. Therefore, referring to FIG. 3, the divided voltage is charged into the capacitor CL and the output signal of the SCSI bus 220 is a low level state. When the signal is applied to the NOR gate 201, the NOR gate 201 outputs a signal of a high level. Therefore, the NMOS transistor 202 is turned on. When the NMOS transistor 202 is turned on, the power voltage outputted from the capacitance terminator 210 and the voltage charged into the capacitor CL are discharged, so that a low level signal is checked at the SCSI bus 220. As described above, when the output signal of the mode selection terminal MSEL, and when the host SCSI driving circuit 200 enters an output mode, the SCSI bus driving circuit 230 of the target 110 enters an input mode, and the data outputted from the SCSI bus driving circuit 200 of the host computer 100 is transmitted to the SCSI bus.

Meanwhile, when the output signal of the mode selection terminal is a high level, the SCSI bus driving circuit 300 enters an input mode. When the high level signal is applied to one side of the OR gate 301, the OR gate 301 outputs a high level signal irrespective of the signal state of the other side thereof and disables the buffer 302. When the buffer 302 is disabled, the SCSI bus 320 maintains a high level state by the capacitance terminator 310 and converted into the input mode so as to receive the data from the target 110. In more detail, when the buffer 302 is disabled in accordance with a high level signal outputted from the OR gate 301, the high level signal is checked at the SCSI bus 320 in accordance with the voltage divided by the resistors R1 and R2 of the capacitance terminator 310. At this time, since the 3-state buffer 331 of the target SCSI bus driving circuit 330 is enabled or disabled in accordance with a data from the target 110, the voltage state of the SCSI bus 320 is converted into a low level state. Thereafter, the converted data is buffered by the SCSI bus 320 and the buffer 303 and is outputted to the host computer 100 through the data input terminal DIN.

Meanwhile, when the signal from the mode selection terminal MSEL is a low level, the host SCSI bus driving circuit 300 of the host computer 100 enters an output mode. When the low level signal is outputted to one side of the OR gate 301, the OR gate enables or disables the buffer 302 in accordance with an output signal of the data output terminal DOUT. When the signal of the data output terminal DOUT is a high level, the OR gate 301 outputs a high level signal and disables the buffer 302. When the buffer 302 is disabled, the power voltage divided by the resistors R1 and R2 in the capacitance terminator 310 is charged into the capacitor CL and enables the SCSI bus 320 to a high level state.

In addition, when the mode selection terminal is a low level state, the OR gate 301 outputs a low level signal and enables the buffer 302. When the buffer 302 is enabled, the voltage charged in the capacitor of the capacitance terminator 310 is discharged through the buffer 302 as shown in FIG. 3, and the SCSI bus 320 maintains a low level state. As described above, when the output signal of the mode selection terminal MSEL is a low level state, and when the host SCSI bus driving circuit 300 enters an output mode, the SCSI bus driving circuit 330 enters an input mode and receives the data outputted from the host SCSI bus driving circuit 300 through the SCSI bus 320.

As described above, the conventional SCSI bus driving circuit is directed to enabling an SCSI bus to have a low level signal state at a high speed when a high level output signal of the data output terminal DOUT is changed to a low level signal. However, when the output signal of the data output terminal DOUT is changed from a low level to a high level, the capacitor and the signal of the SCSI bus are slowly charged. In addition, since it is possible to connect at least 7 targets with a host computer, the capacitance value varies greatly. Moreover, since the delay time increases when the output signal of the data output terminal DOUT is changed from a low level and to a high level, when the capacitance value exceeds 300 pF, the SCSI bus cannot reach a desired high level state at 10 Mbps, whereby the high speed data transmission is impossible.

SUMMARY OF THE INVENTION

Accordingly, it is an object of the present invention to provide an SCSI bus driving circuit, which overcome the problems encountered in a conventional SCSI bus driving circuit.

It is another object of the present invention to provide an improved SCSI bus driving circuit capable of speedily transmitting a data irrespective of the length of a small computer system interface (hereinafter called the "SCSI") bus cable or the number of targets connected to a host computer.

To achieve the above objects, there is provided an SCSI bus driving circuit wherein a host SCSI driving circuit connected to a plurality of target SCSI driving circuit through a capacitance terminator and an SCSI bus, which includes an output buffer for buffering the output signal of a data output terminal of a host computer; and an enabling circuit for detecting the output signal of the output buffer using a logic threshold voltage of a logic gate and logically combining the signal detected and the output signal of a mode selection terminal outputted from the host computer.

DETAILED DESCRIPTION OF THE INVENTION

Figure 1:
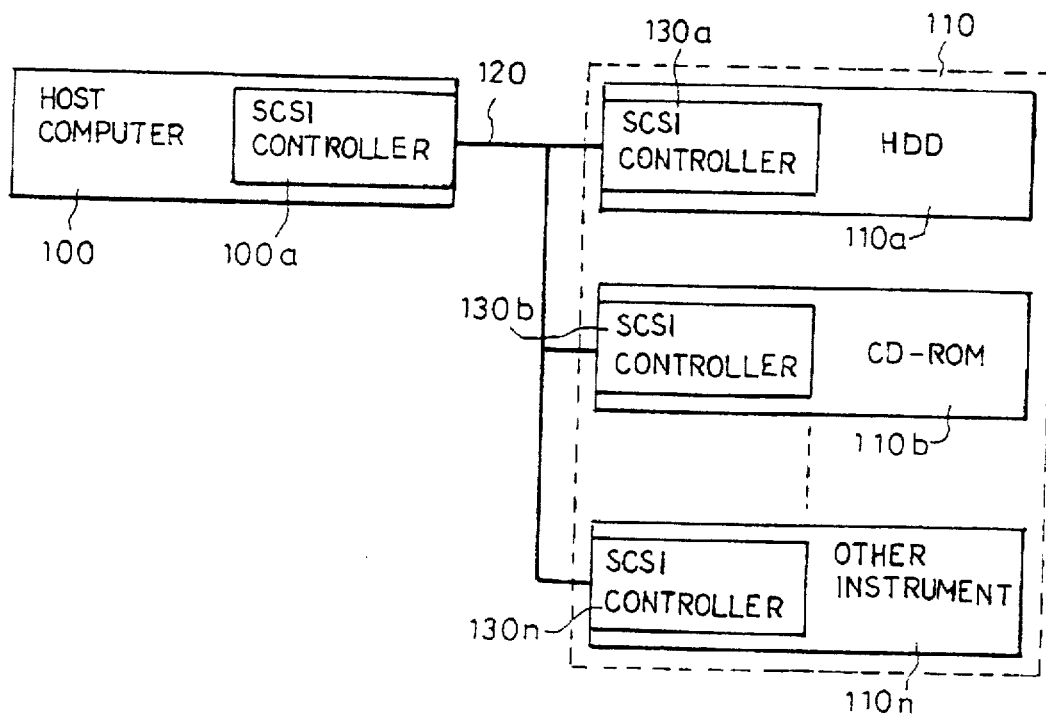
FIG. 1 is a block diagram of a conventional SCSI system.
Figure 2A:
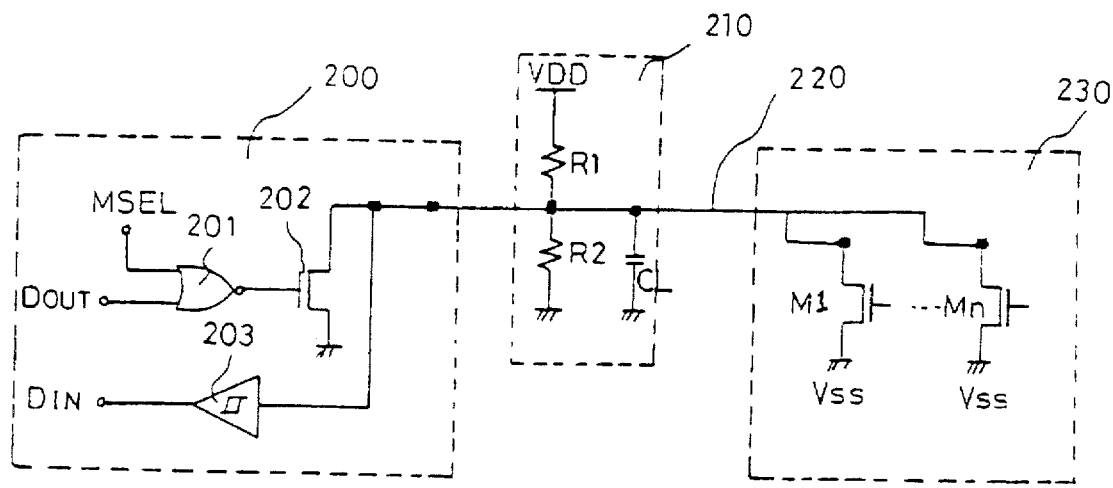
FIG. 2A is a circuit diagram of a conventional open collector type SCSI bus driving circuit.
Figure 2B:
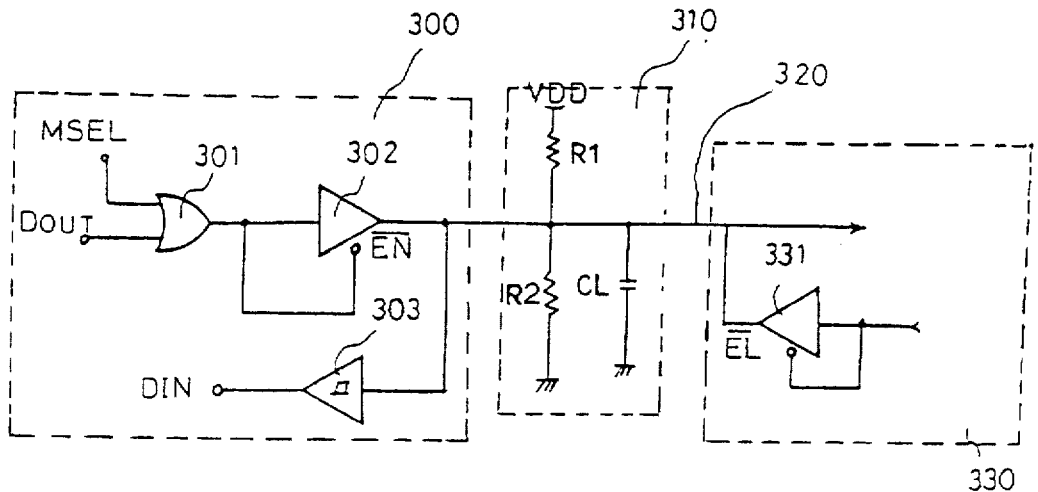
FIG. 2B is a circuit diagram of a 3-state SCSI bus driving circuit.
Figure 3:
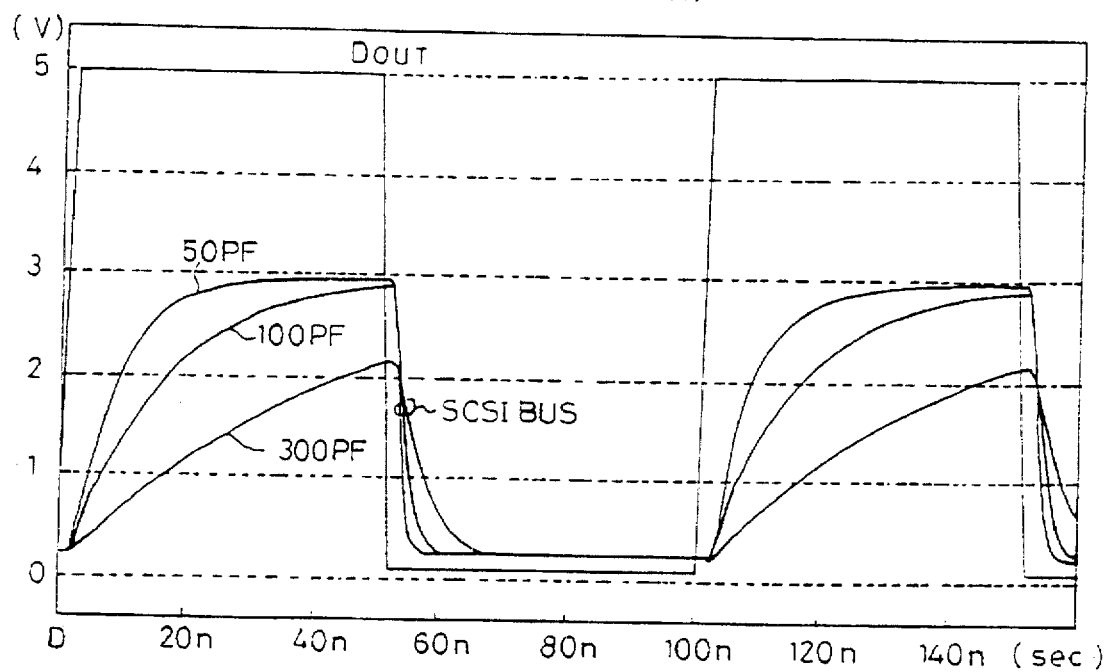
FIG. 3 is a wave form of an output voltage of an SCSI bus driving circuit of FIG. 2.
Figure 4:
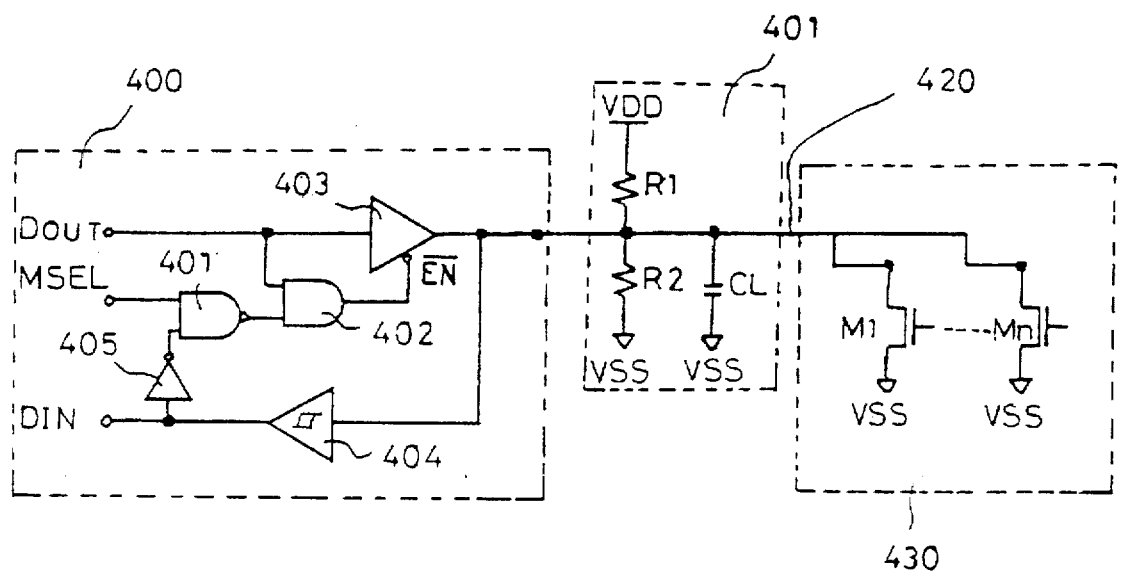
FIG. 4 is a circuit diagram of an SCSI bus driving circuit of a first embodiment of the present invention.

Referring to FIG. 4, a SCSI bus driving circuit of a first embodiment according to the present invention includes a host SCSI bus driving circuit 400 for outputting an input/output command in accordance with a control of the host computer, a capacitance terminator 401 having a common connection point between resistors R1 and R2, connected to a ground through a capacitor CL and to an SCSI bus 420 in which the capacitances R1 and R2 are connected in series between a power voltage Vdd and the ground for interfacing data, a target SCSI bus driving circuit 430 provided in each SCSI controller and having the same functions as the SCSI bus driving circuit 400 for transmitting/receiving data, and an SCSI bus 420 for forming a data transmission path between the host SCSI bus driving circuit 400 and the target SCSI bus driving circuit 430.

The host SCSI bus driving circuit 400 includes a NAND gate 401 for NANDing the output signal of the mode selection terminal MSEL of the host computer and the output signal of an inverter 405, an AND gate 402 for ANDing the output signal of the NAND gate 401 and the output signal of a data output terminal of the host computer, a 3-state buffer 403 enabled or disabled in accordance with an output signal of the AND gate 402 for buffering the output signal of the data output terminal DOUT of the host computer, a trigger buffer 404 for buffering the output signal of the 3-state buffer 403 and for outputting to a data input terminal DIN, and an inverter 405 for inverting the output signal of the buffer 404 and for outputting to one side of the NAND gate 401.

The target SCSI bus driving circuit 430 has the same concept of features as the conventional target SCSI bus driving circuits 230 and 330. The present invention includes a plurality of target SCSI bus driving circuits 430 connected to the SCSI bus driving circuit 400 of one host computer, and the data transmission is available between one host computer and a certain target.

The operation of the SCSI bus driving circuit of a first embodiment according to the present invention will now be explained.

To begin with, when a signal outputted from the mode selection terminal MSEL of the host computer is a high level state, the host SCSI bus driving circuit 400 enters a transmission mode, that is, an output mode. In more detail, when the signal of a high level state outputted from the host compute through the mode selection terminal MSEL is applied to one side of the NAND gate 401, and the signal outputted from the data output terminal DOUT becomes a low level signal, the AND gate 402 outputs a signal of a low level state. Therefore, the buffer 403 is enabled and buffers the output signal of a low level of the data output terminal, and the SCSI bus 420 becomes activated by a low level signal. When the output signal of the buffer 403 is a low level, the voltage divided by the resistors R1 and R2 in the capacitance terminator 410 becomes a low level state by the buffer 403, and the low level signal is outputted to the SCSI bus driving circuit 430. At this time, the buffer 404 outputs the low level signal outputted from the buffer 403 to the inverter 405. The inverter 405 inverts the low level signal applied thereto to a high level signal and outputs to the input terminal of the NAND gate 401, and the NAND gate 401 outputs a low level signal, and the buffer 403 maintains an enabled state.

Figure 7A:
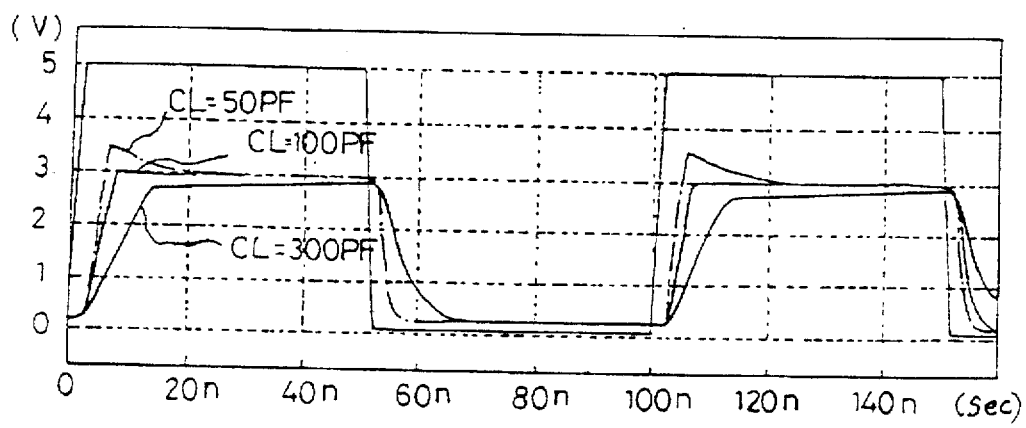
FIG. 7A is a wave form diagram of an output voltage of an SCSI bus driving circuit of FIGS. 4 through 6.

When the state of the output signal of the data output terminal DOUT as shown in FIG. 7A changes from the low level to a high level, the output signal of the NAND gate 401 is a low level, so that the buffer 403 is continuously enabled since the AND gate 402 outputs a low level signal. Therefore, the buffer 403 buffers the signal of the data output terminal of a high level and outputs to the capacitance terminator 410. In the capacitance terminal 410, since a high level signal is applied thereto, the power voltage is charged into the capacitor CL of the capacitance terminator 410. FIG. 7A shows a wave form of an output voltage of the SCSI bus driving circuit 400 with respect to the load capacitance value of the SCSI bus 420. As shown therein, the output voltage of the SCSI bus 420 linearly increases in proportion to the current mount applied thereto.

Figure 7B:
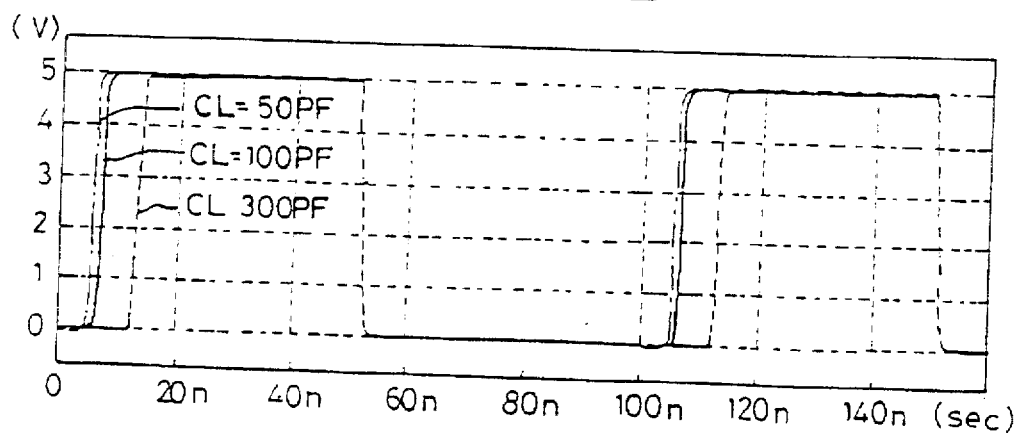
FIG. 7B is a wave form diagram of a signal for controlling a buffer of FIGS. 4 through 6.

When the output voltage of the SCSI bus 420 is greater than a logic threshold voltage Vih (2.0–2.5v) of a Schmitt trigger buffer 404, the buffer 404 buffers the output voltage of the SCSI bus 420 and outputs a high level signal. The high level signal outputted from the buffer 404 is inverted to a low level signal by the inverter 405 and outputted to the NAND gate 401. Therefore, the NAND gate 401 NANDs the output signal of a high level of the mode selection terminal and the output signal of a low level signal of the inverter 405. The AND gate 402 ANDs the high level signal outputted from the NAND gate 401 and the high level signal outputted from the data output terminal DOUT and enables or disables the buffer 403. The signal enabling/disabling the buffer 403 is converted into a high level at a point where the output voltage is in excess of the logic threshold voltage Vth (2.0–2.5v) of the buffer 404, as shown in FIG. 7B. Therefore, the buffer 403 maintains enabled state until the capacitor CL of the capacitance terminator 410 is charged by the logic threshold voltage Vth of the buffer 404. In addition, when the buffer is disabled when the enable signal become a high level, the SCSI bus driving circuit 400 enters a high impedance state, and the SCSI bus 420 maintains a high level 3v by the capacitance terminator 410.

Thereafter, when the output signal of the mode selection terminal MSEL is a high level, the output signal of the data output terminal DOUT is shifted from the high level to a low level. Since the output signal of the NAND gate 401 is a high level, the AND the gate 402 ANDs two input signals, and outputs the low level signal to enable the buffer 403. Therefore, the buffer 403 discharges the charge electric level of the capacitor CL, that is, the output voltage of the SCSI bus 420, in proportion to the amount of Sink as shown in FIG. 7A. Therefore, a high speed data transmission can be possible irrespective of the load variation of the SCSI bus 420.

Meanwhile, when output signal of the mode selection terminal MSEL outputted from the host computer is a low level and outputted to one side of the NAND gate 401, the host SCSI bus driving circuit 400 enters an input mode, that is, a receiving mode. At this time, the NAND gate 401 output a high level signal irrespective of the signal state applied to the other side thereof. Therefore, in an input mode, the NAND gate 401 outputs a high level signal. In addition, the AND gate 402 ANDs the output signal of a high level of the data output terminal DOUT and the output signal of a high level of the NAND gate 401 and disables the buffer 403. Therefore, the SCSI bus driving circuit 400 receives the data of the SCSI bus 420. In addition, the signal transmission to the buffer 403 through the data input terminal DIN is blocked by the NAND gate 401.

The construction of an SCSI bus driving circuit of a second embodiment according to the present invention will now be explained with reference to FIG. 5.

As shown therein, the SCSI bus driving circuit includes an inverter 502 for inverting the output signal of the mode selection terminal MSEL, an OR gate 501 for ORing the signal inverted by the inverter 502 and the output signal of the buffer 505, an AND gate 503 for ANDing the output signal of the OR gate 501 and the output signal of the data output terminal DOUT, a 3-state type buffer 504 enabled or disabled in accordance with an output signal of the AND gate 503 and for buffering the output signal of the data output terminal DOUT, and a Schmitt trigger buffer 505 having an input terminal connected to the output terminal of the buffer 504 for outputting the signal applied thereto to the OR gate 501 and the data input terminal DIN.

The operation of the SCSI bus driving circuit of a second embodiment according to the present invention will now be explained with reference to FIG. 4.

To begin with, when the output signal of a high level of the mode selection terminal MSEL is inputted to the inverter 502, the inverter 502 inverts the signal to a low level signal and outputs to the OR gate 501. At this time, when the output signal of the data output terminal DOUT is a low level, the AND gate 503 outputs a low level signal and enables the buffer 504. Therefore, the low level signal of the data output terminal DOUT is buffered and transmitted to the SCSI bus driving circuit of the targets through the SCSI bus 420. At this time, the voltage charged in the capacitor of the capacitance terminator 410 is discharged and maintains a low level.

When the signal of the data output terminal DOUT is shifted from the low level state and to a high level state, since the charging voltage of the capacitor CL of the capacitance terminator 410 is lower than the logic threshold voltage Vth of the buffer 505, the buffer 505 outputs the low level signal to the input terminal of the OR gate 501, and the OR gate 501 outputs a low level signal. Thereafter, the AND gate 503 ANDs the output signal of a low level of the OR gate 501 and the signal of a high level of the data output terminal DOUT and outputs a low level signal, and enables the buffer 504 continuously. Therefore, the buffer 504 buffers the high level signal of the data output terminal DOUT and outputs to the SCSI bus 420.

When a high level signal is outputted from the buffer 504, the power voltage is charged into the capacitor CL of the capacitance terminal 410. At this time, the voltage of the SCSI bus 420 linearly increases in proportion to the resistance of the capacitance terminator 410 and the voltage outputted from the buffer 504. When the output voltage of the SCSI bus 420 exceeds the logic threshold voltage Vth(2.0–2.5v of the Schmitt trigger buffer 505, the buffer 505 buffers the output voltage of the SCSI bus 420 and outputs a high level signal. The OR gate 501 receives the high level signal outputted from the buffer 505 and outputs the high level signal to the AND gate 503. The AND gate 503 ANDs the output signal of the high level of the OR gate 501 and the signal of the high level of the data output terminal DOUT. The buffer 504 is disabled and stops transmitting the data. At this time, the SCSI bus 420 maintains a high level signal 3v of the capacitance terminator 410.

When the signal of the data output terminal DOUT is shifted from the high level to a low level, the AND gate 503 ANDs the output signal of the OR gate 501 and the output data DOUT of a low level and enables the buffer 504. Therefore, voltage charged in the capacitor of the capacitance terminator is discharged and transmitted to the SCSI bus driving circuit.

Meanwhile, when the SCSI controller of the host computer outputs a low level signal to the SCSI bus driving circuit 500 through the mode selection terminal MSEL so as to receive a data from the corresponding SCSI bus driving circuit, and when the data output terminal DOUT maintains a high level state, the output signal of the mode selection terminal MSEL is inverted to a high level state by the inverter 502 and inputted to the OR gate 501, and the OR gate 501 outputs the high level signal to the AND gate 503. The AND gate 503 ANDs the high level signal outputted from the OR gate 501 and the signal of the data output terminal DOUT maintaining a high level signal state at the time of a receiving mode and outputs a high level signal and disables the buffer 504. The data transmitted from the corresponding SCSI bus driving circuit of the target through the SCSI bus 420 is received through the buffer 505 and transmitted to the SCSI controller of the host computer through the data input terminal DIN.

Figure 6:
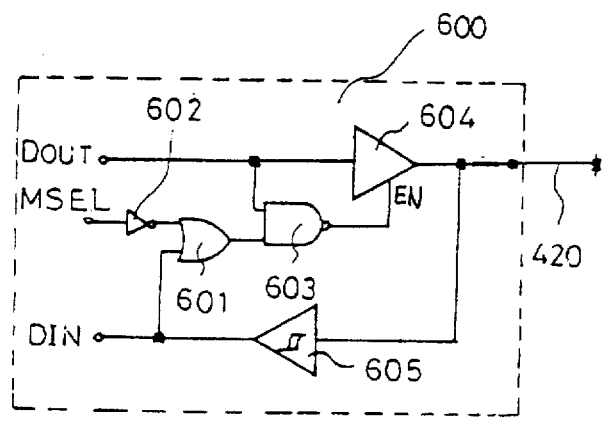
FIG. 6 is a circuit diagram of an SCSI bus driving circuit of a third embodiment of the present invention.

FIG. 6 shows the construction of an SCSI bus driving circuit of a third embodiment according to the present invention.

Figure 5:
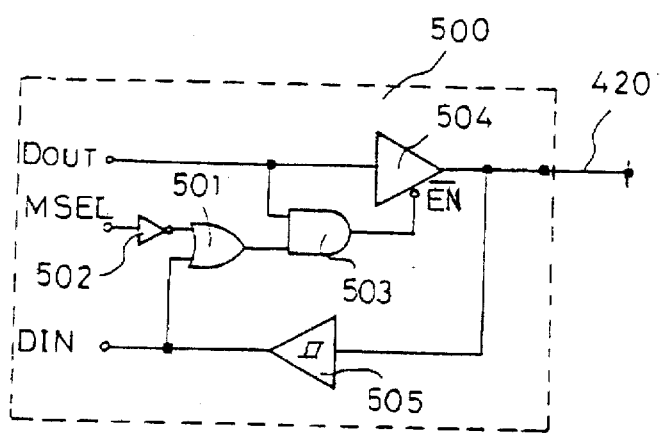
FIG. 5 is a circuit diagram of an SCSI bus driving circuit of a second embodiment of the present invention.

As shown therein, the construction of the third embodiment is the same as in the second embodiment except a NAND gate 603 instead of using the AND gate 503 of FIG. 5 and a buffer 604 which is a 3-state buffer enabled by a high level signal. Therefore, the descriptions of the constructions and operations same to the second embodiment of the present invention will now be omitted.

To begin with, when the host computer outputs a high level signal through the mode selection terminal so as to receive a data and outputs a low level signal through the data output terminal DOUT, the NAND gate 603 outputs a high level signal. When the high level signal is outputted from the NAND gate 603, the buffer 604 is enabled and outputs a low level signal to the SCSI bus 420.

When the signal of the data output terminal DOUT is shifted from the low level to a high level, the NAND gate 603 NANDs the output signal outputted of a low level of the buffer 605 and the OR gate 601 and the signal of a high level outputted from the data output terminal DOUT and outputs a high level signal. Therefore, the buffer 604 is continuously enabled and outputs a high level signal to the SCSI bus 420. At this time, the voltage of the SCSI bus 420 linearly increases in proportion to the voltage level applied from the buffer 604 by the capacitance of the capacitance terminator and the capacitor, as shown in FIGS. 7A and 7B.

When the output voltage of the SCSI bus 420 exceeds the logic threshold voltage Vth of the buffer 605, the buffer 605 buffers the output voltage of the SCSI bus 420 and outputs a high level signal. Thereafter, the NAND gate 603 NANDs the signal of a high level from the buffer 605 and the OR gate 601 and the output signal of a high level of the data output terminal DOUT and outputs a low level signal and disables the buffer 604.

Meanwhile, when the host computer outputs an output signal of a low level signal of the mode selection terminal MSEL, and maintains the output signal of the data output terminal DOUT to have a high level, the NAND gate 603 NANDs the signal and outputs a low level signal and disables the buffer 604. Therefore, the data received from the target is transmitted to the host computer through the SCSI bus 420, the buffer 605, and data input terminal DIN.

As described above, the SCSI bus driving circuit according to the present invention is capable of transmitting the data of a synchronous mode at a high speed (10 Mbps) recommended in an SCSI protocol irrespective of a load capacitance value of an SCSI bus, the length of an SCSI bus cable, and the number of targets.

What is claimed is:

1. A small computer system interface bus driving circuit, wherein a host SCSI driving circuit connected to a plurality of target SCSI driving circuits through a capacitance terminator and a SCSI bus, comprising:

output buffer means for buffering the output signal of a data output terminal of a host computer; and enabling means for detecting the output signal of said output buffer means using a logic threshold voltage of a logic gate and logically combining the signal detected and the output signal of a mode selection terminal outputted from said host computer, wherein said enabling means includes an input buffer for detecting the level of the output signal of said output buffer means using the logic threshold voltage.

2. The circuit of claim 1, wherein said output buffer means is a 3-state type buffer.

3. The circuit of claim 1, wherein said enabling means includes:
- an inverter for inverting the output signal of said input buffer;
- a NAND gate for NANDing the output signal of the mode selection terminal and the output signal of said inverter; and
- an AND gate for ANDing the output signal of said NAND gate and the output signal of the data output terminal and enabling the output buffer means using a result of said NAND gate.

4. The circuit of claim 3, wherein said input buffer is a Schmitt buffer.

5. The circuit of claim 3, wherein said output buffer means is a low active type.

6. The circuit of claim 1, wherein said enabling means includes:
- an inverter for inverting the output signal of the mode selection terminal
- an OR gate for ORing the output signal of said inverter and the output signal of said input buffer; and
- an AND gate for ANDing the output signal of said OR gate and the output signal of the data output terminal and for enabling the output buffer means using a result thereof.

7. The circuit of claim 6, wherein said input buffer is a Schmitt trigger buffer.

8. The circuit of claim 6, wherein said output buffer means is a low active type.

9. The circuit of claim 1, wherein said enabling means includes:
- an inverter for inverting the output signal of the mode selection terminal;
- an OR gate for ORing the output signal of said inverter and the output signal of said input buffer; and
- a NAND gate for NANDing the output signal of said OR gate and the output signal of the data output terminal and for enabling the output buffer means using a result thereof.

10. The circuit of claim 9, wherein said input buffer is a Schmitt trigger buffer.

11. The circuit of claim 9, wherein said output buffer means is a high active type.

12. A bus driver circuit for transferring data between a host computer coupled to a target device on a bus, comprising:
- a first buffer coupled to a data output electrode of the host computer and the bus;
- a second buffer coupled to a data input electrode of the host computer and the bus; and
- a feedback circuit coupled to the data input electrode and said first buffer so as to enable and disable said first buffer for transferring data between the host computer and the target device, wherein said feedback circuit is coupled to a mode selection electrode of the host computer such that the bus driver circuit receives or transmits data based on a potential level applied at the mode selection electrode.

13. The bus driver circuit of claim 12, wherein said feedback circuit enables said first buffer until a potential on the bus is substantially the same as a threshold voltage of said second buffer.

14. The bus driver circuit 13, wherein said first buffer is one of a low active type and a high active type.

15. The bus driver circuit of claim 12, wherein a potential on the bus increases linearly from the first level to the second level.

16. The bus driver circuit of claim 12, wherein said feedback circuit comprises a plurality of logic gates coupled in series and the data input electrode, mode selection electrode, data output electrode and said first buffer.

17. The bus driver circuit of claim 12, wherein said feedback circuit comprises first, second and third logic gates,
- said first logic gate being coupled to the data input electrode and said second logic gate,
- said second logic gate being coupled to the mode selection electrode and said third logic gate, and
- said third logic gate being coupled to the data output electrode and said first buffer.

18. The bus driver circuit of claim 17, wherein said first logic gate, and said second and third logic gates comprise an inverter, and NAND and AND gates, respectively.

19. The bus driver circuit of claim 12, wherein said feedback circuit comprises first, second and third logic gates,
- said first gate being coupled to the mode selection electrode and said second gate,
- said second gate being coupled to the data input electrode and said third gate, and
- said third gate being coupled to the data output electrode and said first buffer.

20. The bus driver circuit of claim 19, wherein said first gate, and said second and third gates comprise an inverter, and OR and AND gates, respectively.

21. The bus driver circuit of claim 19, wherein said first gate, and said second and third gates comprise an inverter, and OR and NAND gates, respectively.

22. A system for transferring data, comprising:
- a host device;
- a target device;
- a bus coupling said host device and said target device; and
- a capacitance terminator coupled to said bus at a connection node between said host and target devices, wherein said host device includes a data bus drive circuit having
  - a first buffer coupled to a data output electrode of the host device and the bus,
  - a second buffer coupled to a data input electrode of the host device and the bus, and
  - a circuit having a plurality of logic gates coupled to the data input electrode and said first buffer, said logic circuit enabling said first buffer to transfer data applied at the data output electrode from said host device to said target device until a potential at the connection point is substantially the same as a threshold voltage of said second buffer.

23. The system of claim 22, wherein said logic circuit is coupled to a mode selection electrode of the host device such that the driver circuit receives or transmits data based on a potential level applied at the mode selection electrode.

24. The system of claim 23, wherein said plurality of logic gates comprises first, second and third logic gates,
- said first logic gate being coupled to the data input electrode and said second logic gate,
- said second logic gate being coupled to the mode selection electrode and said third logic gate, and
- said third logic gate being coupled to the data output electrode and said first buffer.

25. The system of claim 24, wherein said first logic gate, and said second and third logic gates comprise an inverter, and NAND and AND gates, respectively.

26. The system of claim 23, wherein said plurality of logic gates comprises first, second and third logic gates,
- said first gate being coupled to the mode selection electrode and said second gate,
- said second gate being coupled to the data input electrode and said third gate, and
- said third gate being coupled to the data output electrode and said first buffer.

27. The system of claim 26, wherein said first gate, and said second and third gates comprise an inverter, and OR and AND gates, respectively.

28. The system of claim 26, wherein said first gate, and said second and third gates comprise an inverter, and OR and NAND gates, respectively.

29. The system of claim 22, wherein said first buffer is one of a low active type and a high active type.

* * * * *